United States Patent
Osen et al.

(10) Patent No.: US 11,187,767 B2
(45) Date of Patent: Nov. 30, 2021

(54) MAS PROBEHEAD WITH A THERMALLY INSULATED SAMPLE CHAMBER

(71) Applicant: Bruker BioSpin GmbH, Rheinstetten (DE)

(72) Inventors: David Osen, Ettlingen (DE); Alexander Krahn, Karlsruhe (DE); Constantin Schalck, Germersheim (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 50 days.

(21) Appl. No.: 16/790,889

(22) Filed: Feb. 14, 2020

(65) Prior Publication Data

US 2020/0264250 A1 Aug. 20, 2020

(30) Foreign Application Priority Data

Feb. 14, 2019 (DE) ...................... 10 2019 202 001.1

(51) Int. Cl.
  *G01R 33/30* (2006.01)
  *G01R 33/31* (2006.01)
(52) U.S. Cl.
  CPC ........... *G01R 33/31* (2013.01); *G01R 33/307* (2013.01)
(58) Field of Classification Search
  CPC ................ G01R 33/30–307; G01R 33/46–465
  See application file for complete search history.

(56) References Cited

U.S. PATENT DOCUMENTS

| 4,254,373 A | * | 3/1981 | Lippmaa | ................ G01R 33/31 324/321 |
| 4,587,492 A | | 5/1986 | Laudermilch | |
| 4,940,942 A | * | 7/1990 | Bartuska | ................ G01R 33/31 324/307 |
| 5,202,633 A | * | 4/1993 | Doty | ..................... G01R 33/307 324/321 |
| 5,530,353 A | * | 6/1996 | Blanz | ..................... G01R 33/31 324/315 |

(Continued)

FOREIGN PATENT DOCUMENTS

CN 105044634 A 11/2015
CN 107870309 A 4/2018

*Primary Examiner* — Patrick Assouad
*Assistant Examiner* — Demetrius R Pretlow
(74) *Attorney, Agent, or Firm* — Edell, Shapiro & Finnan LLC

(57) ABSTRACT

An MAS probehead (1) positioned in a magnet bore (2) includes a sample chamber (3) with a stator (4) for receiving a rotor and an RF coil that radiates RF pulses into and/or receives RF signals from an NMR sample (5). A temperature-control apparatus guides gas at a first variable temperature $T_1$ into the sample chamber and through the stator during an NMR measurement, and guides a pressurized gas stream at a second variable temperature $T_2$ around the sample chamber. The sample chamber is surrounded by an encapsulation device (6), at least in the azimuthal direction around the axis of the magnet bore and counter to the flow direction of the pressurized gas, and is oriented to provide an air gap (7') between the sample chamber and the magnet bore. This prevents dissipation of the gas temperature to outer parts of the probehead, and yields larger NMR measurement temperature ranges.

17 Claims, 2 Drawing Sheets

(56) References Cited

U.S. PATENT DOCUMENTS

| | | | |
|---|---|---|---|
| 10,101,416 B2* | 10/2018 | Bouleau | G01R 33/30 |
| 10,175,311 B2* | 1/2019 | De Paepe | G01R 33/31 |
| 10,241,064 B2* | 3/2019 | Endo | G01N 24/08 |
| 10,459,044 B2 | 10/2019 | Osen et al. | |
| 2005/0035766 A1* | 2/2005 | Wind | G01R 33/307 |
| | | | 324/322 |
| 2005/0122107 A1 | 6/2005 | Hasegawa et al. | |
| 2006/0152221 A1* | 7/2006 | Doty | G01R 33/3635 |
| | | | 324/318 |
| 2006/0176056 A1 | 8/2006 | Doty et al. | |
| 2010/0026302 A1* | 2/2010 | Doty | G01R 33/34015 |
| | | | 324/318 |
| 2010/0109666 A1* | 5/2010 | Armbruster | G01R 33/34 |
| | | | 324/318 |
| 2011/0018536 A1* | 1/2011 | Mullen | G01R 33/307 |
| | | | 324/307 |
| 2012/0176133 A1* | 7/2012 | Sirigiri | H01J 25/025 |
| | | | 324/318 |
| 2014/0099730 A1* | 4/2014 | Hu | G01R 33/307 |
| | | | 436/173 |
| 2014/0125340 A1* | 5/2014 | Hunkeler | G01R 33/307 |
| | | | 324/321 |
| 2015/0048829 A1* | 2/2015 | De Paepe | G01R 33/3403 |
| | | | 324/321 |
| 2016/0223628 A1* | 8/2016 | Fujiwara | G01R 33/307 |
| 2016/0231397 A1* | 8/2016 | Mizuno | G01R 33/3403 |
| 2016/0291102 A1* | 10/2016 | Matsunaga | G01R 33/445 |
| 2016/0334478 A1* | 11/2016 | Osen | G01R 33/302 |
| 2017/0176362 A1* | 6/2017 | Endo | G01R 33/31 |
| 2017/0199255 A1* | 7/2017 | Bouleau | F25B 9/00 |
| 2017/0248404 A1* | 8/2017 | Freytag | G01R 33/38 |
| 2018/0088190 A1* | 3/2018 | Osen | G01R 33/31 |
| 2018/0164234 A1* | 6/2018 | Nishiyama | G01N 24/082 |
| 2020/0002828 A1* | 1/2020 | Mills | C25B 13/04 |
| 2020/0072917 A1* | 3/2020 | Fujiwara | G01R 33/282 |
| 2020/0103478 A1* | 4/2020 | Fujiwara | G01R 33/307 |
| 2020/0200843 A1* | 6/2020 | Endo | G01R 33/307 |

* cited by examiner

MAS PROBEHEAD WITH A THERMALLY INSULATED SAMPLE CHAMBER

CROSS REFERENCE TO RELATED APPLICATIONS

This application claims foreign priority under 35 U.S.C. § 119(a)-(d) to German Application No. 10 2019 202 001.1 filed on Feb. 14, 2019, the entire contents of which are hereby incorporated into the present application by reference.

FIELD OF INVENTION

The invention relates to an MAS probehead, which is installed inside a magnet bore during operation of an NMR-MAS arrangement

BACKGROUND

Such an MAS probehead includes a sample chamber, which comprises an MAS stator for receiving an MAS rotor and an RF coil that serves to radiate RF pulses into an NMR sample and/or to receive RF signals from the NMR sample. A temperature-control apparatus is present in order to guide gas at a first variable temperature $T_1$ into the sample chamber and through the MAS stator during an NMR measurement so as to set the temperature of the NMR sample and in order to simultaneously guide pressurized gas at a second variable temperature $T_2$ around the sample chamber.

Such an MAS probehead is known from U.S. Pat. No. 4,587,492 A (=citation [1]).

NMR (=nuclear magnetic resonance) spectroscopy is a powerful method in structural chemistry and biology, where the chemical composition of a substance can be analyzed. During a NMR measurement, RF (=radio frequency) pulses are radiated into the sample, which is located in a strong static magnetic field, and the electromagnetic reaction of the sample is detected. The electromagnetic irradiation of the sample and the detection of the NMR signal is realized by an rf circuit inside an NMR probe. In some cases it is necessary to spin the sample around an axis that is tilted by the "magic angle" with respect to the external static magnetic field in order to reduce the broadening of the measured NMR signals caused by inter-spin interactions. This method is commonly referred to as magic angle spinning (MAS).

The MAS rotor is positioned in a gas bearing inside an MAS stator where the gas pressure, the gas flow and the gas temperature are controlled by an external control unit. To spin the MAS rotor around the magic angle a second gas stream is directed to the rotor cap that has a specific geometry to transform the kinetic energy of the drive gas into a rotational motion. This means that NMR-MAS probeheads comprise a pressurized gas-operated stator which comprises a plurality of mutually separated pressurized gas supplies for the aforementioned purposes, which are typically guided from a gas supply unit to the MAS module where the NMR measurement takes place.

The present invention relates to an MAS probehead that is intended to be introduced into the bore of the magnet system of an NMR spectrometer. During operation, the temperature of the MAS sample must be controlled in a range from −120° C. to +400° C., depending on the application. The relative heat or coldness, which essentially originates from the pressurized gas for the bearing nozzles and/or the temperature-control nozzles, has previously been dissipated to the outside in uncontrolled fashion, with the immediate surroundings then necessarily being brought to the same temperature. In particular, this affects the NMR shim coils, which are located directly outside of a usually employed RF shielding tube but in any case are located in the direct vicinity of the wall of the magnet bore in the radial direction, said shim coils then being heated or cooled in uncontrolled fashion and, as a result thereof, being impaired in their function.

Previously, the interior of the magnet bore, in particular the RF shielding tube, was flushed with a so-called flush gas (usually $N_2$ or dried air); however, the thermal insulation is lacking, especially in a sensitive region of the shim tube, since heat is not efficiently absorbed by the flush gas and dissipated in a defined direction.

The exhaust gases from the sample chamber flow through the exhaust air bore in the RF shielding tube and leave the magnet system in the upward direction. As a result, the complete upper portion of the probehead and of the upper part of the magnet system are involuntarily also subject to temperature control, possibly leading to overheating or else undercooling of the spectrometer region above the probehead. The adjacent shim tube, which is typically manufactured of Al, can absorb the heat and transfer this heat to the sensitive regions of the shim coils. The emergence of supercooled air from the probehead into the room temperature bore of the magnet may lead to icing of the components upon contact with the external air or lead to the ingress of water condensation.

An additional problem arises if the ram pressure increases as a result of the installation of a sample transfer system or a sample robot such that the exhaust gases flow out downward through the electronics of the probehead.

Disadvantages of the current art lie in the fact that, inter alia, numerous probehead and magnet components have to be designed for these temperature ranges. In the extreme case, there may be a deactivation of the sample temperature control and overheating or icing of spectrometer components.

US 2010/0026302 A1 (=citation [2]) describes an MAS system which thermally insulates the NMR sample from the coil (and the RF components). Temperature-controlled gas flows are only used to provide temperature control of the measurement probe in the spinner itself, with the exhaust air being guided to the outside through a conduit. The region outside of the thermal insulation is not insulated with respect to the outer wall of the probehead, as a result of which there can be a heat transfer from the probehead to the shim system. Accordingly, the entire sample chamber is therefore insulated in relation to the surroundings. Coil and sample are at approximately the same temperature.

US 2015/0048829 A1 (=citation [3]) discloses an MAS probehead, in which the temperature-controlled exhaust air from the stator (i.e. drive gas flow, tempering gas flow control and bearing gas flow) is used to provide energy from the exhaust air in a heat exchanger within a heat shield ("insulation screen"), said exhaust air possibly being too hot (risk of burns for the user) or too cold (risk of condensation). A separate gas stream is not provided. Nor does citation [3] describe that and how the temperature differences between the stator and outer region of the probehead can be insulated since the heat exchanger is loaded with the temperature-controlled gases precisely where the thermal coupling of the heat exchanger with the shield actually causes the outer region of the probehead to assume the temperature of the inner region.

US 2005/0122107 A1 (=citation [4]) provides an NMR probe that has a vacuum-insulated container and a detector part. The detector portion is cooled by a cooling device in order to increase the sensitivity at which NMR signals are captured. There is no disclosure of any type of thermal insulation by a gas flow. Citation [1], cited at the outset, discloses a temperature-control apparatus for an NMR-MAS probehead through which a tempered gas flow flows axially. This prior art intends not only to keep the NMR sample at a constant temperature using this temperature-control apparatus but also to create a thermal barrier between the measurement sample disposed in the innermost region of the magnet bore and the gradient coils disposed further to the outside in the radial direction. To this end, a shielding gas flow that is guided around the MAS stator at a radial distance and that is separate from the drive gas flow and the tempering gas flow of the rotor should be used, said shielding gas flow, in the direction of the NMR magnet but within the magnet bore, being surrounded by a sleeve ("solid thermal barrier") to the outside in the radial direction. Together with the shielding gas flow, this sleeve should form a thermal barrier in front of the gradient coils. However, a thermal encapsulation of this shielding gas flow from the region of the sample chamber is not provided.

By contrast, however, a physical, spatial and, especially, thermally effective separation of the drive and temperature-control gas streams from the shielding gas stream would also be desirable.

SUMMARY

In relation thereto, one object of the present invention is to modify, with particularly simple technical measures and without significant additional structural outlay, an MAS probehead of the type defined at the outset in such a way that a dissipation of the heat or coldness, which prevails in the sample chamber, to the outside is prevented as efficiently as possible, and so outer lying components of the probehead, in particular the temperature-sensitive shim coils, are consequently effectively thermally shielded with respect to the parts close to the stator. Moreover, the invention should also render a significantly larger temperature range usable for the NMR measurement.

Brief Description of the Invention

This complicated object is achieved, in a likewise surprisingly simple yet also effective manner, by virtue of the sample chamber being surrounded by an encapsulation device in a generic MAS probehead with the features defined at the outset, at least in the azimuthal direction around the axis of the magnet bore and counter to the flow direction of the pressurized gas, and by virtue of said sample chamber being positioned so that an air gap is present between the sample chamber and the magnet bore of the NMR-MAS arrangement.

Hence, the sample chamber, which also contains the MAS turbine, is effectively thermally insulated from the magnetic bore or a surrounding RF shielding tube. According to the invention, this thermal insulation is caused by virtue of the sample chamber with the MAS system comprising the MAS stator being encapsulated such that all temperature-controlled exhaust gases, both from the bearing nozzles and from the drive nozzles, are guided out of the probehead in only one direction (upwardly as a rule) in controlled fashion through the channels provided to this end. The temperature-control gas, in particular, but also the bearing gases are subject to significant temperature control depending on the respective application, as a result of which the sample chamber reaches the temperature of the bearing gas during the measurement.

The encapsulation device according to the invention can be embodied as a rigid tube, or else as a film coating or as a plastic sleeve. In any case, the encapsulation device should be constructed from a temperature-resistant material. Thus, polyimides, for example, could be used as the material, for instance a Kapton® film. Moreover, a base plate is provided, as a rule, as a lower termination of the encapsulation device, said base plate preferably having a rigid embodiment and containing the passages for the electric and pneumatic feed lines.

Express reference is made here to the fact that the advantages of the invention can be obtained not only in the case of vertical NMR spectrometers but also in NMR systems with a horizontal or oblique z-axis. The specified axial positions then no longer necessarily need to lie "above" or "below" the NMR magnet system, but optionally also to the "right" or "left" of same. In any case, gravity tends to play a subordinate role in the principle of operation of the present invention.

Exemplary Embodiments of the Invention

Exemplary embodiments of the probehead according to the invention are distinguished in that electronic components comprising resonator structures, preferably all electronic components with the exception of the RF coil, are located outside of the encapsulation device, in particular in the region of the pressurized gas at the second variable temperature $T_2$.

As a rule, electronic resonator structures are very sensitive to temperatures and should therefore not be subject to the same temperature control as the sample chamber. Therefore, they are situated in the region of the second variable temperature $T_2$. In comparison with the prior art according to citation [1], no "thermal barrier", however, is required to this end.

In one class of advantageous embodiments of the invention, an exhaust gas system is provided, which guides the gas flows at the first variable temperature $T_1$ and at the second variable temperature $T_2$ from the probehead in spatially separated fashion.

If the temperature-control flows at $T_1$ and $T_2$ already mix in the probehead, the heat can be transferred to sensitive magnet regions at the center of the magnet by way of the thermal conductivity of the components. Therefore, it is advantageous if the temperature-control gas flow at $T_1$ is guided within the gas flow at $T_2$ and the flows are only combined far above the measurement center of the magnet since the temperature-sensitive shim system is typically located at the measurement center.

According to further advantageous embodiments of the invention, the air gap is arranged in azimuthal circumferential fashion between the sample chamber and magnet bore and is embodied to pass the pressurized gas at the second variable temperature $T_2$ in longitudinal direction within the magnet bore.

In this way, a circumferential uniform insulation effect is obtained, where no outer region of the NMR probe is significantly warmer or colder than any other region.

Advantageous developments of these embodiments are distinguished in that the encapsulation device and the magnet bore each have a cylindrical form with parallel cylinder axes, in particular identical cylinder axes, and in that an air gap between the encapsulation device and magnet bore is designed circumferentially with the same cross section.

This is because the cooling or heating effect is particularly uniform and efficient if the flow speed is the same along the circumference. Temperature gradients could form otherwise. The best approximation to an ideal laminar flow is obtained by this cylindrical air gap.

Embodiments of the invention in which the air gap between the sample chamber and magnet bore for passing the pressurized gas at the second variable temperature $T_2$ has a radial narrowing, which extends in the axial direction of the magnet bore, in the axial region of the sample chamber, said narrowing preferably being between 0.1 mm and 1 mm, are also preferred.

As a result, the gas flow accelerates and the dissipation of the excess heat (coldness) is more efficient and the insulation effect is increased.

In practice, embodiments in which the air gap between the sample chamber and the magnet bore for passing the pressurized gas at the second variable temperature $T_2$ is designed in such a way that a gas flow with a gas quantity of 2 to 50 standard liter/min, preferably of between 10 and 25 standard liter/min, can flow therethrough have also proven their worth.

This is because the gas flow has improved efficiency for the dissipation of the excess heat (or coldness) in the case of a greater gas quantity.

Great practical advantages were also found in embodiments of the MAS probehead according to the invention that are distinguished by virtue of the MAS stator being surrounded by a shielding tube made of electrically conductive material for shielding against RF radiation and by virtue of the encapsulation device being disposed within the shielding tube in such a way that the gas flow with the pressurized gas at the second variable temperature $T_2$ is guided outside of the sample chamber, through an air gap between the encapsulation device and the shielding tube.

The temperature-control flow $T_1$ can be guided within the shielding tube. Since the shielding tube is made of a metal that typically has a good thermal conductivity in the direction of the magnet, it is even more important that the heat from the probehead does not reach the shielding tube.

In further preferred embodiments of the invention, the encapsulation device has at least two inlets for gas with a variable temperature $T_1$, through which inlets at least two partial flows of the gas with a variable temperature $T_1$ can be introduced into the sample chamber, with the partial flows each containing gas at different temperatures $T'_1$, $T''_1$, $T'''_1$ and/or gas for different functions, preferably for bearing the MAS rotor by the gas or for rotationally driving the MAS rotor or for controlling the temperature of an NMR sample.

At least one gas flow—according to the current design of the apparatus in any case—is required to bear the rotor (and usually also used for temperature control of the latter), and a second gas flow is required to mechanically drive said rotor. However, the temperature-control of the rotor can also be effectuated—independently of the bearing thereof—by a third gas flow.

In one class of advantageous embodiments of the probehead according to the invention, the exhaust gas system extends a distance s from the MAS stator into the magnet bore, said distance being greater than the maximum external diameter of the MAS stator, in particular s>3 cm.

This is because the gas flows at a temperature $T_1$ should strike the magnet bore as far away from the magnet center as possible as said gas flows influence the magnet and the shim system.

Preferred are developments of this class of embodiments, in which the gas flows emerging from the sample chamber are guided in thermal isolation from one another along at least a part of the distance s, to be precise in such a way that the gas of variable temperature $T_1$ is guided within the pressurized gas at the second variable temperature $T_2$. This has the additional advantage that the thermal influence on the shim system is further reduced.

The exhaust gas system may comprise a plurality of bores, which are preferably applied in the shielding tube and dimensioned in such a way that length/diameter ratio of the bores is at least 4.

In practice, embodiments in which the exhaust gas system is embodied in such a way that the gas flows emerging from the sample chamber can be heated and/or cooled and/or mixed, together or individually, depending on requirements, have also proven their worth.

As a result, the temperature of the exhaust gas can be brought to room temperature or close to room temperature, resulting in the shim system not being impaired and, additionally, the risk of the moisture in the room condensing or freezing at the emergence point of the magnet bore, which is at room temperature, or of the user suffering burns being reduced.

Developments of these aforementioned embodiments in which a heating or cooling device, preferably an electric heating coil, a Peltier element or a heat exchanger, is provided in the part of the exhaust gas system distant from the MAS stator, said heating or cooling device being used, where necessary, to heat or cool gas flows emerging from the sample chamber, preferably the gas at variable temperature $T_1$, are also preferred.

In the case of very cold measurements, $T_1<0°$ C., icing over may occur where the gas flow emerges from the bore. This does not happen if the temperature is controlled. In the case of measurements at very high temperatures, $T_1>100°$ C., there is, secondly, the risk of the user suffering burns. This should likewise be avoided at all costs.

A further preferred embodiment provides for the MAS probehead according to the invention to have a transfer system connected following the exhaust gas system, the exhaust gas flows still being guided separately from one another in said transfer system, in particular up to a mixing chamber.

This is advantageous in that the gas flows at a temperature $T_1$ strike the magnet bore as far away from the magnet center as possible since said gas flows influence the magnet and the shim system. The transfer system can be embodied as a component that is separate from the probehead, which is placed on the probehead in interlocking fashion in order to receive the gas flows.

Finally, an embodiment in which the MAS stator is mounted in pivotable or rotatable form, in particular for setting the MAS angle, is also advantageous. As a result of the rotatability of the stator in the probehead, the introduction and removal of the MAS rotor can be further simplified in the case of a restricted space; tight curves are avoided. As a result of the rotatability of the stator, the angle of the stator bearing axis with respect to the direction of the longitudinal extent of the tube (which regularly corresponds, at least to a good approximation, to the direction of the static magnetic field in the NMR magnet) can be reduced in comparison with the magic angle for loading and unloading purposes.

The scope of the present invention also includes an NMR-MAS measurement arrangement comprising an MAS probehead according to the invention, as described above, said NMR-MAS measurement arrangement also being able to comprise an NMR magnet system and, optionally, a shim system and a cryostat.

However, the scope of the present invention also includes a method for operating an NMR-MAS arrangement comprising an MAS probehead of the above-described type according to the invention, said method being characterized in that the temperature of the gas flows at the first variable temperature $T_1$ is maintained between −120° C. and 400° C. and the pressurized gas at the second variable temperature $T_2$ is maintained between 10° C. and 30° C.

Further advantages of the invention emerge from the description and the drawing. Likewise, the features specified above and the features yet to be explained below can find use according to the invention, in each case individually on their own or together in any combinations. The shown and described embodiments should not be understood to be a comprehensive listing but instead are of exemplary nature for the purposes of describing the invention.

BRIEF DESCRIPTION OF THE DRAWINGS

The invention is illustrated in the drawing and will be explained in more detail on the basis of exemplary embodiments.

In detail.

DETAILED DESCRIPTION

Figure 1:
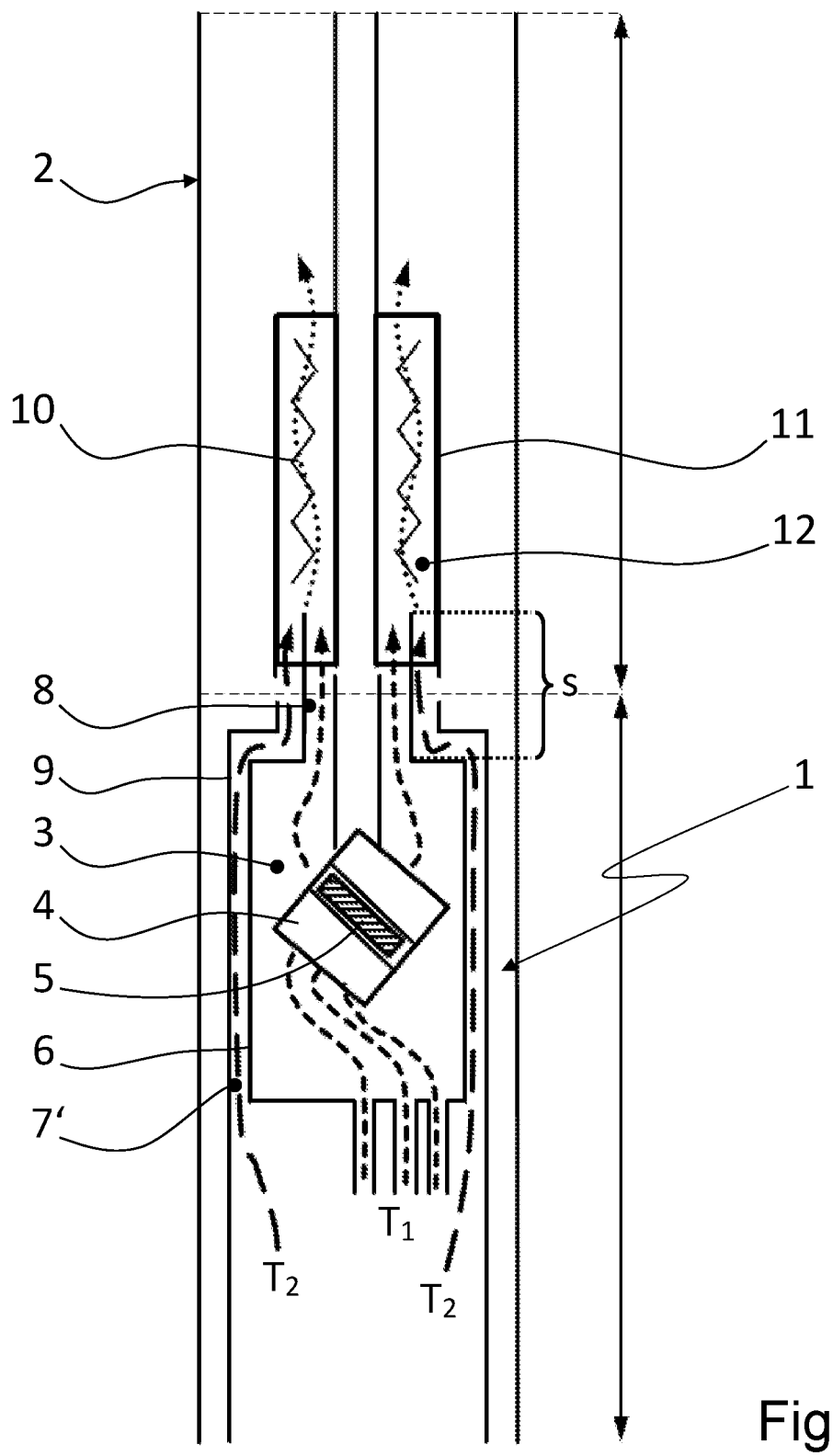
FIG. 1 shows a very schematic vertical sectional illustration of an embodiment of the MAS probehead according to the invention with an RF shielding tube.

The present invention considers a specifically modified probehead for an NMR spectrometer, in particular for MAS applications, in which a spatial separation, and hence also, especially, a thermal separation, of the sample chamber from temperature-sensitive assemblies outside of said chamber is obtained.

The figures of the drawing, which have been kept schematic for the sake of clarity, each show a vertical sectional plane of an MAS probehead 1 according to the invention, for insertion into a magnet bore of an NMR magnet system which, just like the NMR spectrometer, is not illustrated in more detail in the drawing.

During operation, the probehead 1 is disposed in a magnet bore 2 of an NMR-MAS arrangement and comprises a sample chamber 3, which contains an MAS stator 4 for receiving an MAS rotor and an RF coil that serves to radiate RF pulses into an NMR sample 5, which is situated within an MAS rotor, and/or to receive RF signals from the NMR sample 5. Additionally, channels for streams of gas providing temperature-controlled gas flows (designated herein also simply as a temperature-control apparatus) are present in order to guide gas at a first variable temperature T1 into the sample chamber 3 and through the MAS stator 4 during an NMR measurement so as to set the temperature of the NMR sample 5 and in order to simultaneously guide pressurized gas at a second variable temperature T2 around the sample chamber 3.

According to the invention, the NMR probehead 1 is distinguished in relation to the known prior art in that the sample chamber 3 is surrounded by an encapsulation device 6, at least in the azimuthal direction around the axis of the magnet bore 2 and counter to the flow direction of the pressurized gas, and is disposed such that an air gap 7 is present between the sample chamber 3 and the magnet bore 2 of the NMR-MAS arrangement.

In the embodiment according to FIG. 1, the MAS stator 4 is surrounded by a shielding tube 9 made of electrically conductive material for shielding against RF radiation. Here, the encapsulation device 6 is disposed within the shielding tube 9 so that the gas flow of the pressurized gas at the second variable temperature $T_2$ is guided outside of the sample chamber 3 and through an air gap 7' between the encapsulation device 6 and the shielding tube 9—and hence also between the sample chamber 3 and the magnet bore 2.

Figure 2:
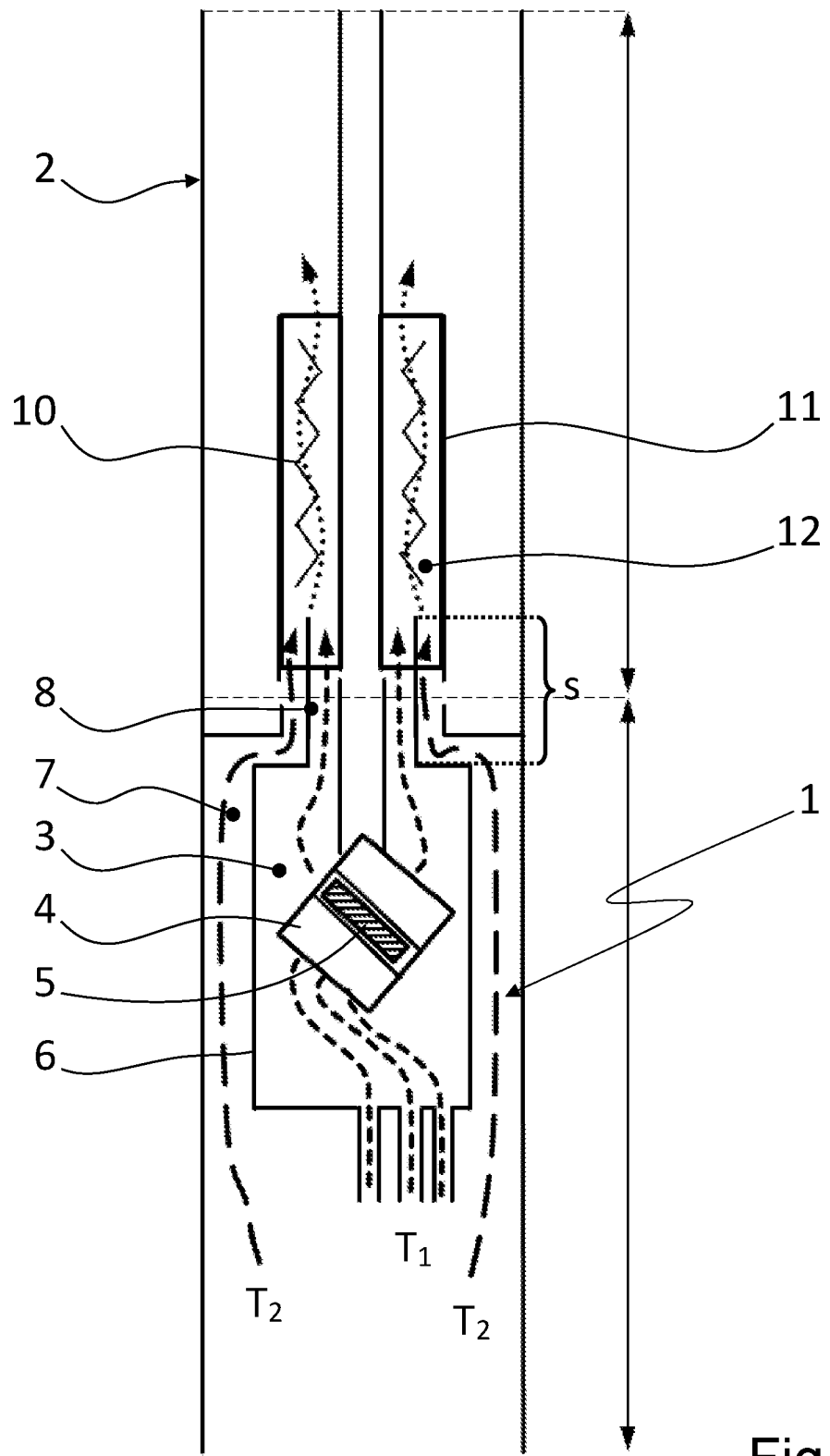
FIG. 2 shows a similar embodiment to FIG. 1, but without an RF shielding tube.

The slightly simpler embodiment illustrated in FIG. 2 differs from the embodiment according to FIG. 1 in that the shielding tube 9 is omitted in this case. In this embodiment, the function of shielding the sample chamber 3 from external RF radiation and also of shielding the outside from the radiation in the sample chamber 3 produced by the RF coils is substantially implemented by the magnet bore 2. Therefore, the air gap 7 extends between the sample chamber 3 and the magnet bore 2.

In both embodiments of the probehead 1 according to the invention illustrated in the drawing, provision is made of an exhaust gas system 8 in each case, the latter guiding the gas flows at the first variable temperature $T_1$ and at the second variable temperature $T_2$ from the probehead 1 in spatially separated fashion. The gas flows emerging from the sample chamber 3 are guided in a manner thermally insulated from one another along at least part of the distance s. Moreover, the exhaust gas system 8 is embodied so that the gas flows emerging from the sample chamber 3 can be heated and/or cooled and/or mixed, together or individually, depending on requirements.

A heating or cooling device 10, which may be embodied as an electric heating coil, as a Peltier element or as a heat exchanger and which can be used to heat or cool gas flows emerging from the sample chamber 3, preferably the gas at variable temperature $T_1$, depending on requirements, is provided in the part of the exhaust gas system 8 distant from the MAS stator 4.

Following the exhaust gas system 8, a transfer system 11 is connected, within which the exhaust gas flows are still guided separate from one another along a distance s, in particular as far as a mixing chamber 12.

A—preferably circumferential—air gap 7; 7' is situated between the encapsulated sample chamber 3 and the shielding tube 9, an additional gas flow at room temperature being guided in said air gap such that the heat transfer between sample chamber 3 and shielding tube 9 is made more difficult thereby. The air gap 7; 7' is designed such that the circulating air absorbs the amount of heat dissipated by the sample chamber 3. In the present case, the air gap 7; 7' is dimensioned in the range of 0.1-1.0 mm. The principle also works for larger or smaller air gaps; what is decisive here is the flow speed at the surface to be subject to temperature control and the maximum/minimum temperature of the surface to be insulated. This narrowing distinguishes the temperature control according to the invention from the prior art, in which flush gases are likewise guided within a shielding tube. However, the flow speed of the flush gas is accelerated by the narrowing and can consequently absorb the heat or coldness of the sample chamber 3 substantially more efficiently. The airflow is approximately 2 to 50 standard liters/min, preferably 10 to 25 standard liters/min. A heat transfer to the shielding tube 9 is therefore almost entirely prevented (thermal insulation).

The figures show how the sample chamber 3 is encapsulated and how the flush gas flows around the chamber.

Both the gas flow at the first variable temperature $T_1$ and the gas flow at the second variable temperature $T_2$ are guided separately from one another to the outside. Hence, the hot/cold MAS work gases are guided from the sample chamber to the outside in thermally insulated fashion and can be mixed/heated/cooled outside where necessary. The "insulation distance" is therefore also continued above the sample chamber 3 and can, when necessary, be extended upwardly. This measure guides all gases at potentially critical temperature away from the sensitive region within the magnet.

Optionally, a transfer system 11 is connected to the upper probehead interface, said transfer system continuing to guide these separated gas flows in separated fashion until said gas flows can be mixed in a mixing chamber 12 and can be heated when necessary such that the gas mixture flowing out of the probehead 1 only mixes with ambient air outside of the probehead. The transfer system 11 absorbs the gases flowing out of the shielding tube 9 and initially guides these through the HR turbines that are usually installed in spectrometers before said gases are mixed and, where necessary, heated by a heating coil so that the spectrometer does not ice over.

LIST OF REFERENCE SIGNS

1 NMR probehead
2 Magnet bore
3 Sample chamber
4 MAS stator
5 NMR sample
6 Encapsulation device
7 Air gap between sample chamber and magnet bore
7' Air gap between probehead and magnet bore
8 Exhaust gas system
9 RF shielding tube
10 Heating or cooling device
11 Transfer system
12 Mixing chamber

LIST OF CITATIONS

Publications Considered for the Assessment of Patentability

[1] U.S. Pat. No. 4,587,492 A
[2] US 2010/0026302 A1
[3] US 2015/0048829 A1
[4] US 2005/0122107 A1

What is claimed is:

1. A magic angle spinning (MAS) probehead, configured for insertion into a magnet bore during operation of a nuclear magnetic resonance magic angle spinning (NMR-MAS) arrangement, comprising:
a sample chamber, which comprises an MAS stator for receiving an MAS rotor and a radio frequency (RF) coil that serves to radiate RF pulses into an NMR sample and/or to receive RF signals from the NMR sample,
a first gas stream at a first variable temperature $T_1$ guided into the sample chamber and through the MAS stator during an NMR measurement, for setting the temperature of the NMR sample, and a second, pressurized gas stream at a second variable temperature $T_2$ guided, simultaneously with the first gas stream, around the sample chamber, and
an encapsulation device that surrounds the sample chamber, at least in an azimuthal direction around an axis of the magnet bore and counter to a flow direction of the pressurized gas stream, and that is oriented to form an air gap between the sample chamber and the magnet bore of the NMR-MAS arrangement.

2. The probehead as claimed in claim 1, further comprising electronic components other than the RF coil, that are located outside of the encapsulation device in the region of the pressurized gas stream at the second variable temperature $T_2$.

3. The probehead as claimed in claim 2, wherein the electronic components comprise all electronic components of the probehead other than the RF coil, and include resonator structures and electric transmission lines.

4. The probehead as claimed in claim 1, further comprising an exhaust gas system, which guides the gas stream at the first variable temperature $T_1$ spatially separated from the gas stream at the second variable temperature $T_2$.

5. The probehead as claimed in claim 1, wherein the air gap is arranged in azimuthal circumferential fashion between the sample chamber and the magnet bore and is embodied to pass the pressurized gas at the second variable temperature $T_2$ within the magnet bore.

6. The probehead as claimed in claim 5, wherein the encapsulation device and the magnet bore each have respective cylindrical forms with parallel cylinder axes, and wherein the air gap between the encapsulation device and the magnet bore is circumferentially uniform in cross section.

7. The probehead as claimed in claim 1, wherein the magnet bore extends in an axial direction, and wherein the air gap between the sample chamber and the magnet bore, for guiding the pressurized gas stream at the second variable temperature $T_2$ radially narrows in the axial direction of the magnet bore, in an axial region of the sample chamber.

8. The probehead as claimed in claim 1, wherein the air gap between the sample chamber and the magnet bore for guiding the pressurized gas stream at the second variable temperature $T_2$ is configured for a gas flow with a gas quantity of 2 to 50 standard liter/min.

9. The probehead as claimed in claim 1, further comprising a shielding tube surrounding the MAS stator and made of electrically conductive material for shielding against RF radiation, wherein the encapsulation device is located within the shielding tube such that the gas flow with the pressurized gas stream at the second variable temperature $T_2$ is guided outside of the sample chamber, through an air gap between the encapsulation device and the shielding tube.

10. The probehead as claimed in claim 4, wherein the exhaust gas system extends a distance s from the MAS stator into the magnet bore, and wherein the distance s is greater than a maximum external diameter of the MAS stator.

11. The probehead as claimed in claim 10, wherein the gas flows emerging from the sample chamber are guided in thermal isolation from one another along at least a part of the distance s.

12. The probehead as claimed in claim 4, wherein the exhaust gas system is embodied to heat and/or to cool the gas flows emerging from the sample chamber.

13. The probehead as claimed in claim 12, further comprising a heating or cooling device provided in a part of the exhaust gas system distant from the MAS stator, wherein the heating or cooling device heats or cools the gas flows emerging from the sample chamber.

14. The probehead as claimed in claim 13, wherein the heating or cooling device comprises an electric heating coil or a heat exchanger configured to heat or cool gas flows emerging from the sample chamber at variable temperature $T_1$.

15. The probehead as claimed in claim 4, further comprising a transfer system connected downstream from the exhaust gas system, such that the exhaust gas flows are guided separately from one another into the transfer system.

16. The probehead as claimed in claim 15, wherein the transfer system is configured to guide the exhaust gas flows up to a mixing chamber.

17. A method for operating an nuclear magnetic resonance (NMR) magic angle spinning (MAS) arrangement with an MAS probehead as claimed in claim 1, comprising:
  maintaining a temperature of the gas stream at the first variable temperature $T_1$ between −120° C. and 400° C.; and
  maintaining the pressurized gas stream at the second variable temperature $T_2$ between 10° C. and 30° C.

\* \* \* \* \*